United States Patent [19]

Radjy

[11] Patent Number: 5,191,556
[45] Date of Patent: Mar. 2, 1993

[54] METHOD OF PAGE-MODE PROGRAMMING FLASH EEPROM CELL ARRAYS

[75] Inventor: Nader Radjy, Palo Alto, Calif.

[73] Assignee: Advanced Micro Devices, Inc., Sunnyvale, Calif.

[21] Appl. No.: 668,608

[22] Filed: Mar. 13, 1991

[51] Int. Cl.$^5$ ............................................. G11C 13/00
[52] U.S. Cl. .................................. 365/235; 365/182; 365/185; 365/218
[58] Field of Search .................. 365/182, 185, 189.01, 365/218, 235

[56] References Cited

U.S. PATENT DOCUMENTS 4,423,432  8/1978  Stewart ................................ 365/105
4,958,321  9/1990  Chang .................................. 365/185

OTHER PUBLICATIONS

*A 4MB 5V-Only Flash EEPROM With Sector Erase* by Stiegler et al., 1990, IEEE Symposium on VLSI Circuits, CH2885-2/90/0000-0103.
*A 5-Volt Contactless Array 256 Kbit Flash EEPROM Technology* by Gill et al., 1988, IEDM, CH2528-8/88/0000-0428.
*A 5-V Only 256K Bit CMOS Flash EEPROM* by D'Arrigo et al., 1989 IEEE International Solid-State Circuits Conference, 0193-6530/89/000-0132, Session 10, THAM 10.3.
ATMEL Corp. AT29C256 (265K (32K×8)5 Volt Only CMOS PEROM) preliminary device description.
*Flash Memory* by Walt Lahti, In-Stat Inc.
*A New Flash E$^2$PROM Cell Using Triple Polysilicon Technology* by Masuoko et al., 1984, IEDM, CH2099-0/84/0000-0464, Section 17.3.
*A Single Transistor EEPROM Cell and Its Implementation in a 512K CMOS EEPROM* by Mukherjee et al., 1985, IEEE, CH2552-5/85/0000-0616, section 26.1.
*A 128K Flash EEPROM Using Double Polysilicon Technology* by Samachisa et al., 1987, IEEE International Solid-State Circuits Conference, session VII, WPM 7.4.
*An In-System Reprogrammable 256K CMOS Flash Memory* by Kynett et al., 1988, IEEE International Solid-State Circuits Conference, session X, THAM 10.7.
*A 90ns Look Erase/Program Cycle Megabit Flash Memory* by Kynett et al., 1989, IEEE International Solid-State Circuits Conference, session X, THAM 10.7.
*1024 K (128K×8)CMOS Flash Memory*, Apr. 1990, INTEl Corp., 28F010.

*Primary Examiner*—Terrell W. Fears
*Attorney, Agent, or Firm*—Flehr, Hohbach, Test, Albritton & Herbert

[57] ABSTRACT

An improved method of programming EEPROM cells in a memory array, wherein a cell page can be programmed and erased without disturbing other cell pages in the array, and further, an individual cell can be reprogrammed without disturbing other cells in the array. The user can selectively erase and program cells in the array by controlling the operating conditions of the word lines, bit lines, and Vss lines coupled to those cells according to the method of the present invention.

8 Claims, 1 Drawing Sheet

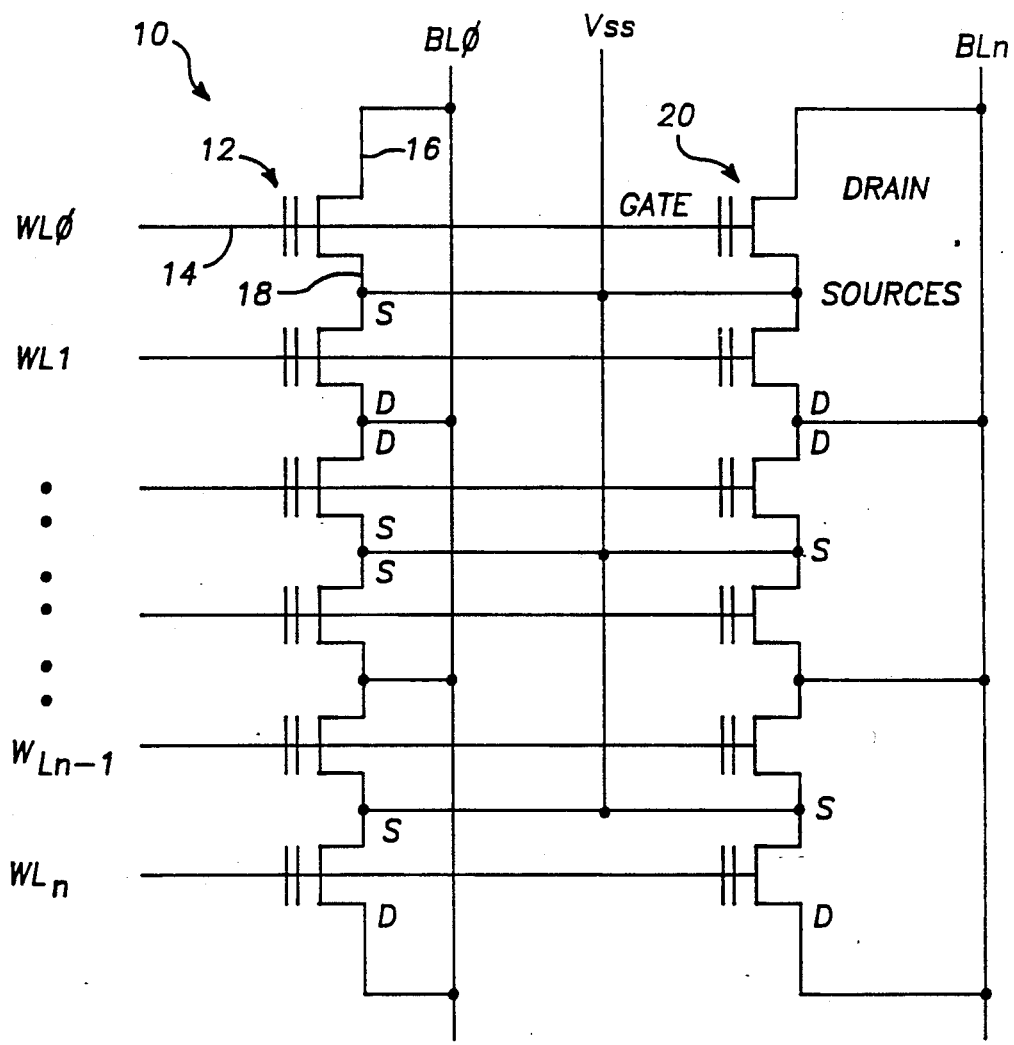
FIG.–1
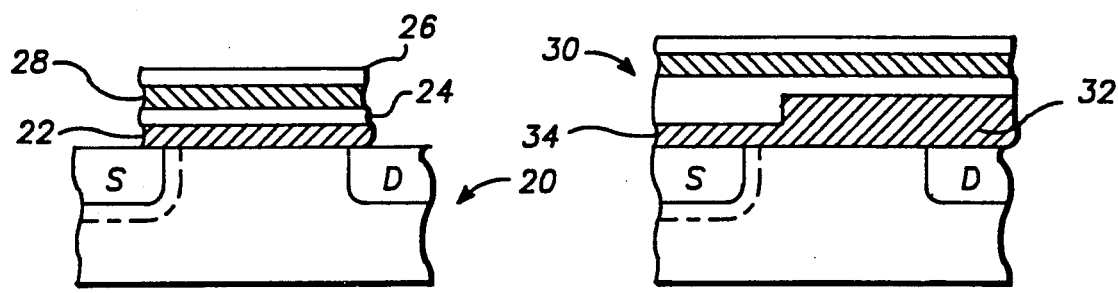
(PRIOR ART)
FIG.–2
FIG.–3

METHOD OF PAGE-MODE PROGRAMMING FLASH EEPROM CELL ARRAYS

BACKGROUND OF THE INVENTION

1. Field of the Invention

This invention relates generally to flash EEPROM cells, and more particularly to a method of programming and erasing EEPROM cells.

2. Description of Related Art

Erasable read-only memory cells, widely known as EPROMs, are a versatile type of nonvolatile semiconductor memory. A typical N-channel EPROM cell is composed of an N-channel silicon-gate storage transistor which uses a floating first layer polysilicon gate (floating gate), which is directly accessed via a second stacked polysilicon gate (control gate), to trap and store electrons for extremely long periods of time.

The N-channel EPROM cell is considered to be in a programmed state when the floating gate has a net negative charge due to the presence of "hot electrons" injected from the drain. When the cell is in a programmed state, the electrons on the floating gate keep the N-channel transistor in a logical off state.

Conversely, the cell is considered to be in an erased state when there are no electrons on the floating gate and thus no net negative charge on the gate. To erase the cell, the energy of the electrons stored on the floating gate is raised until the electrons can "tunnel" through the tunnel dielectric from the gate to the source, a phenomenon commonly known as Fowler-Nordheim tunneling. When the cell is erased, the N-channel transistor is in a logical on state. Note that N-channel EPROMs are preferred over P-channel EPROMs due to the programmability and speed advantages of N-channel EPROMs.

EPROMs are conventionally UV-erasable. That is, to erase the cell, relatively high-intensity ultraviolet light is used to excite floating gate electrons and cause them to move off the gate. There are a number of disadvantages with UV-erasable EPROMs. For example, such cells require the use of costly clear quartz windows to allow for UV irradiation of the floating gates. Additionally, the entire array of exposed EPROM cells is erased, even when it is desired to erase only a few cells. To overcome shortcomings such as these, flash electrically erasable read-only memory, widely known as flash EEPROMs, were developed.

Flash EEPROMs typically use Fowler-Nordheim tunneling, as opposed to hot-electron injection, for cell programming as well as for cell erase. A voltage signal, usually less than 25 volts, is applied to the control gate, which is capacitively coupled to the floating gate, while the drain is held either at ground potential or at a voltage less than that applied to the control gate, and the source is held at ground potential. Under such conditions, Fowler-Nordheim tunneling occurs, in which electrons from the drain, tunnel through a thin layer of $SiO_2$ (tunnel dielectric) to the floating gate.

An important difference between EEPROMs and EPROMs is in the way in which the cells are erased, or more specifically, the way in which the floating gate electrons are removed. Unlike UV-erasable EPROMs, a conventional EEPROM cell electrically induces Fowler-Nordheim electron tunneling to erase the floating polysilicon gate. A voltage signal, typically less than 25 volts, is applied to the cell drain while the control gate is held at ground potential and the source is left at a floating, or unspecified, voltage potential. As a result, the electrons stored on the floating gate will tunnel through the tunnel dielectric to the source.

An advantage of electrical erase over UV erase is that electrical erase can allow for selective erasure of cells in an array, as opposed to erasure of all cells in an array. A conventional EEPROM cell contains an additional "select" gate to control erasure of that cell. By providing a byte-decode transistor for each EEPROM cell in a memory array to control its select gate, selective erase of individual cells or bits in the array can be achieved as opposed to full-array erase in the case of UV-erasable EPROM memory arrays.

Although selective erase can thus be achieved, the additional select gate, for example, causes an EEPROM cell to be somewhat larger than an EPROM cell.

An alternative type of EEPROM cell known as the flash EEPROM cell does not contain an additional select gate and thus is smaller than a conventional EEPROM cell.

However, a memory array of flash EEPROM cells typically cannot be selectively erased due to the absence of select gates. Like an EPROM cell array, all the cells in a flash EEPROM cell array are erased even when not all of the cells in the array need to be erased. Moreover, flash EEPROMs often are more prone to program disturb problems than are conventional EEPROMs due to their different array architecture and absence of byte selection circuitry.

Memory arrays using flash EEPROMs often employ a "chip-mode" program cycle. First, all the cells in the array are programmed (logic off state). Second, all the cells in the array are erased (logic on state). Lastly, individual cells in the array are selectively programmed, while other cells remain in the erased state. Note that all the cells in the memory array are programmed first before they are erased in order to avoid "over-erasing". For an over-erased cell, unselected cells can become leaky leading to incorrect sensing of a selected bit on the same bit line and it will also be difficult to program the bit again.

Chip mode programming suffers from the disadvantage that every time a single cell (data bit) needs to be programmed, the whole chip must undergo the above-described cycle. Accordingly, all the cells must go through at least one program and erase cycle. As a result, some cells are unnecessarily cycled, i.e. programmed and erased, leading to unnecessary and premature wearout. Additionally, the average programming time can be unnecessarily long.

In view of the foregoing, it is a general objective of the present invention to provide an improved method for selective erase of flash EEPROM cells.

SUMMARY OF THE INVENTION

Broadly, the invention discloses an improved method for programming a memory array of flash EEPROM cells, which allows for reduced cycling, and thus longer endurance for a typical cell in a memory array, and reduced average programming time. More particularly, the page mode programming method of the present invention can be implemented by preventing erasure of cells that are to be left undisturbed by raising the voltage level at their associated control/floating gates so as to oppose and cancel the field caused by the application of a voltage signal to the associated sources during erase.

Thus, the present invention provides a method for selectively programming flash EEPROM cells in a memory array, in order to achieve greater programming efficiency and to prolong the endurance of flash EEPROM cells in a memory array by permitting selective erase of cells in the array.

BRIEF DESCRIPTION OF THE DRAWINGS

The features and advantages of this invention will be better understood by referring to the following description given with reference to the accompanying drawings in which like reference numbers refer to like parts, and in which:

FIG. 1 is a diagram illustrating a portion of a n×n memory array of flash EEPROM cells in accordance with the present invention;

FIG. 2 shows a cross-sectional diagram of an earlier EEPROM cell; and

FIG. 3 shows a cross-sectional diagram of a split-gate EEPROM cell in accordance with one embodiment of the present invention.

DETAILED DESCRIPTION OF THE PREFERRED EMBODIMENT

The present invention offers an improved method of programming flash EEPROM cells in a memory array, wherein a single cell can be programmed without erasing all the cells in the array. The page mode programming method of the present invention utilizes selective erase of cells, as opposed to full-array erase used in chip mode programming, resulting in greater programming efficiency, faster programming time, and longer endurance of cells.

FIG. 1 illustrates a portion of an n×n memory array 10 of flash EEPROM cells for implementation of the present invention. A typical cell 12 includes a control/-floating gate 14 attached to a word line (WL0), a drain 16 attached to a bit line (BL0), and a source 18 attached to a Vss line. Cells in the array are arranged in "pages". A page is defined as a series of cells with source terminals coupled to a common Vss line and with control gates coupled to a common word line. For example, cells with control gates attached to WL0 and sources attached to a common Vss line comprise a page of memory cells, two of which (cells 12 and 20) are shown in FIG. 1. In the preferred embodiment, eight such cells comprise a byte of memory. Each cell in a page has a different bit line (BL0-BLn) attached to its drain.

To erase cells in the memory array 10 according to the well-known chip mode programming method, a voltage Vpp is applied via the line labeled Vss to the sources of all the cells, the bit lines are left floating, and word lines are all held at ground potential. The entire memory array is erased as a result of this chip mode method. However, according to the page mode method of the present invention, selective erase of cell pages can be accomplished by supplying a voltage near Vpp to the word lines of those pages which are to be left undisturbed. That is, the erase procedure will be canceled in those pages whose word lines are at Vpp instead of ground potential. A detailed description of the operation of the page mode method of the present invention follows.

In the page mode program cycle, only the cells of the memory array to undergo the cycle are programmed to the logic off state by tying their sources via the line labeled Vss to ground potential, applying Vpp to the control/floating gates via the word lines, and holding the bit lines high at some voltage between Vpp (12 volts) and Vcc (5 volts) to induce hot electron injection into the dielectric from the drain. Note that not all the cells of the memory array need to be initially programmed as is the case in the chip mode cycle, because not all the cells are erased using the page mode.

Once the initial programming is complete, the erase procedure is performed. However, unlike the chip mode erase stage, only selected cell pages are erased to the logic on state in the page mode erase stage. Erase is accomplished by applying Vpp to the sources via the line labeled Vss, the drains left at a floating potential, and tying the control/floating gates to ground potential via the word lines. Selective erase is achieved by holding the word lines of those cell pages to be left undisturbed, that is not erased, at a voltage near Vpp, instead of at ground potential, to cancel and oppose the erase process in those cell pages. Finally, selective programming is performed to complete the cycle by programming only those cells whose bit lines are high, which entails applying a voltage potential between Vcc and Vpp to the drains of the cells to be programmed in order to induce electron tunneling.

For example, if the user wants to selectively program the cell 12 corresponding to bit 00, without unnecessarily erasing all the cells first, the procedure illustrated in the following Table can be employed.

| Function | Source Vss | Gate | | Drain | |
| --- | --- | --- | --- | --- | --- |
| | | WL$\phi$ | WL1-WLn | BL$\phi$ | BLi-BLn |
| Program bits on WL$\phi$ | $\phi$ | Vpp | $\phi$ | Hi | Hi |
| Erase bits on WL$\phi$ | Vppi | $\phi$ | $\approx$Vppi | Float | Float |
| Program bit $\phi\phi$ | $\phi$ | Vpp | $\phi$ | Hi | $\phi$ |

First, during the initial programming stage, WL0 is held at Vpp to program all the cells of page 0, the page which contains cell 00 while the other word lines, line $V_{ss}$ and WL1-WLn are held at ground potential.

Next, only the cells attached to WL0 are erased by tying WL0 to ground and holding WL1 through WLn near potential $V_{pp}$ to cancel the erase in those cell pages. Line $V_{ss}$ is held at $V_{pp}$.

Finally, cell 12 can be exclusively programmed by holding BL0 high, holding WL0 at Vpp, holding line Vss at ground, and tying all other bit lines and word lines to ground potential. It will be appreciated that other cells of the array can be programmed using similar procedures.

Details of the implementation of the circuitry used to inhibit erasure by holding word lines high is provided in commonly assigned patent application Ser. No. 07/426,601, filed Oct. 23, 1989, entitled FLASH EEPROM ARRAY WITH PAGED ERASED ARCHITECTURE invented by Van Buskirk, et al., which is expressly incorporated by this reference.

FIG. 2 shows a cross-sectional profile drawing of an earlier EEPROM cell 20, with a uniform tunnel dielectric 22 of approximately 100 Å, which can be programmed according to the method of the present invention. The floating gate 24 is separated from the control gate 26 by an interpoly dielectric 28.

The method of the present invention also can be applied to a split-gate cell 30 such as shown in FIG. 3, wherein a gate dielectric 32 (dielectric on the drain side of the cell) is thicker than on the source side, i.e. the tunnel dielectric 34. The gate dielectric 32 is approximately 200 Å thick, and the thickness of the tunnel dielectric is approximately 100 Å. For further details of the split-gate flash EEPROM cell, reference commonly assigned patent application, U.S. Pat. No. 4,958,321, issued Sep. 18, 1990, entitled ONE TRANSISTOR FLASH EPROM CELL invented by Chi Chang, which is expressly incorporated herein by this reference.

A major advantage of the split-gate cell is that it reduces program disturb. Program disturb, in which the drain voltage induces an unwanted electric field across the tunnel dielectric (i.e. between the drain and the floating gate) during long program-select periods, may result in memory loss (i.e., electron loss from the floating gate) in certain cells. The thicker dielectric on the drain side of the cell reduces such charge leakage from the floating gate to the drain. Additionally, the thinner dielectric on the source side of the cell still allows for easy electron tunneling from the floating gate to the source.

Therefore, the present invention provides an improved method of programming flash EEPROM cells in a memory array by page mode programming. The method of the present invention provides much of the program selectability advantage of conventional EEPROM cells and the size advantage of flash EEPROM cells. Thus, the invention allows for more efficient cell-to-cell programming and reduced cell wearout.

While the present invention has been described with reference to specific embodiments, the description is illustrative and is not intended to limit the invention. Various modifications to the described method may be employed by those skilled in the art without departing from the true spirit and scope of the invention as defined by the appended claims.

What is claimed is:

1. For use in an array including a plurality of flash EEPROM cells, wherein each of said flash EEPROM cells can be programmed and erased, the array including a Vss line common to the sources of the cells, a plurality of respective word lines, each common to respective control/floating gates of a particular respective series of the cells, and a plurality of respective bit lines, each common to drains of cells in a particular respective position in the particular respective series of cells, a method for programming the flash EEPROM cells in said memory array comprising the steps of:
   programming cells coupled to the Vss line and to at least one of the word lines of the memory array;
   erasing the cells coupled to the Vss line and to at least one of the word lines;
   in the course of said step of erasing, inhibiting erase of cells exclusive of the cells coupled to both the Vss line and to the at least one of the word lines; and
   selectively programming individual cells coupled to the Vss line and to the at least one of the word lines.

2. The method of claim 1 wherein said first step of programming includes the steps of:
   holding the Vss line at ground potential;
   holding the word line which is common to both the cells coupled to the Vss line and to the at least one of the word lines at a voltage Vpp; and
   holding the bit lines of the cells coupled to both the Vss line and to the at least one of the word lines at a high voltage level.

3. The method as in claim 1 wherein said step of erasing includes the further steps of:
   holding the Vss line at voltage potential Vpp;
   holding the word line common to both the cells coupled to the Vss line and to the at least one of the word lines at ground potential; and
   holding the bit lines of the cells coupled both to the Vss line and to the at least one of the word lines at a floating voltage potential.

4. The method of claim 3 wherein said step of inhibiting erase includes the step of:
   holding the word lines common to the cells exclusive of the cells coupled to both the Vss line and to the at least one of the word lines at a voltage near Vpp.

5. The method of claim 1 wherein said step of selectively programming includes the steps of:
   holding the Vss line at ground potential;
   holding the word line which is common to both the cells coupled to the Vss line and to the at least one of the word lines at a voltage Vpp; and
   holding the bit lines of at least one of the cells coupled to both Vss and to the at least one of the word lines at a high voltage level.

6. For use in an array including a plurality of flash EEPROM cells including at least one respective $V_{ss}$ line and a plurality of bit lines and a plurality of word lines, the array being organized into a plurality of respective pages, each respective page including a plurality of cells which include sources coupled both to a respective $V_{ss}$ line and include gates coupled to a respective one of the plurality of word lines, and include drains coupled to respective ones of the plurality of bit lines, the method comprising the steps of:
   programming cells of at least one respective page;
   erasing the cells of the at least one respective page;
   in the course of said step of erasing, inhibiting erase of cells in at least one other respective page; and
   selectively programming individual cells of the at least one respective page.

7. The method of claim 6,
   wherein said first step of programming includes, programming cells of multiple respective pages;
   wherein said step of erasing includes erasing the cells of the multiple respective pages; and
   wherein said step of selectively programming includes programming individual cells of the multiple respective pages.

8. The method of claim 7 wherein said step of inhibiting includes inhibiting erase of cells in multiple other respective pages.

* * * * *